United States Patent

Gamble et al.

[15] 3,641,368

[45] Feb. 8, 1972

[54] LOGIC CIRCUIT WHICH TURNS ON AND OFF RAPIDLY

[72] Inventors: Edward Bernard Gamble; Ramon Hess Aires, both of Los Angeles, Calif.

[73] Assignee: RCA Corporation

[22] Filed: Aug. 10, 1970

[21] Appl. No.: 62,515

[52] U.S. Cl. ..............................307/254, 307/215, 307/300

[51] Int. Cl. ..............................H03k 17/00, H03k 19/08

[58] Field of Search ..................307/300, 254, 268, 263, 215

[56] References Cited

UNITED STATES PATENTS 3,194,979 7/1965 Toy ..............................307/300 X
3,160,765 12/1964 Krossa ..............................307/300 X
3,275,854 9/1966 Cianciola ..............................307/300 X
3,512,016 5/1970 Huang et al ..............................307/300

*Primary Examiner*—John Zazworsky
*Attorney*—H. Christoffersen

[57] ABSTRACT

A controllable shunt current path such as the conducting emitter-to-collector path of a first transistor, is connected in shunt with the emitter-to-base path of a conducting output transistor. In response to a turnoff signal for the output transistor, the first transistor is caused to conduct more heavily in a direction to stop forward conduction of the emitter-to-base diode of the output transistor and in this way to speed up its turnoff. Other features of the circuits illustrated include overload current protection and means for speeding up the discharge of any charge present at an output terminal upon switching of an output transistor from a nonconducting to a conducting condition. One of the circuits illustrated also includes means for ensuring proper sharing of current drive to a pair of transistors and means for ensuring "soft" saturation of the output transistor.

15 Claims, 3 Drawing Figures

INVENTORS
EDWARD B. GAMBLE &
RAMON H. AIRES
BY Henry Schlanger
Attorney

INVENTORS
EDWARD B. GAMBLE &
RAMON H. AIRES
BY Henry Schanzer
Attorney

LOGIC CIRCUIT WHICH TURNS ON AND OFF RAPIDLY

BACKGROUND OF THE INVENTION

Digital circuits are used for performing logic operations in computers and other processing equipment. For most applications, it is desired that such circuits operate at high speed with low power dissipation and have safety features such as short circuit protection. But improvements in some of these characteristics normally are accompanied by problems in meeting other performance requirements. For example, an increase in speed is normally achieved at the cost of a corresponding increase in power dissipation. As a second example, short circuit protection is often obtained at the expense of limiting the speed of response of the circuit.

It is an object of this invention to provide a logic circuit of improved design in the sense that a number of its performance characteristics are concurrently improved in power.

SUMMARY OF THE INVENTION

Circuit means for improving the performance of a logic circuit having a first transistor whose emitter is coupled to the collector of a second transistor at an output terminal, and also having means responsive to one input signal condition for concurrently turning the first and second transistors on and off, respectively, and responsive to another input signal condition for concurrently turning the first and second transistors off and on, respectively.

In a preferred embodiment, current generating means, having a conduction path and a control electrode whose applied potential determines the conduction level within the conduction path, has its conduction path connected across the base-to-emitter region of said second transistor and its control electrode alternating current (AC) driven by a signal in-phase with the signal driving said first transistor.

Another aspect of the invention includes a regulating circuit including means for sensing the current level within means connecting the emitter of the first transistor to the collector of the second transistor and which in response to a signal across said means, exceeding a given value, reduces the current flowing from said first transistor into said output terminal.

In still another aspect of the invention feedback means which may include part of the regulating circuit are coupled between the output and the signal responsive means. In response to a potential difference between the output and the signal responsive means due to an abrupt change in the input signal condition the feedback means conducts current from the output terminal to the signal responsive means which then feeds that current to that one of the first and second transistors whose increased conduction minimizes the potential difference.

In still another aspect of the invention, means are provided to prevent the saturation of at least one of the output transistors.

In still another aspect of the invention means are provided for properly current sharing the current drive to the output transistors.

BRIEF DESCRIPTION OF THE DRAWINGS

In the accompanying drawings, like reference characters denote like components.

DESCRIPTION OF THE INVENTION

Figure 1:
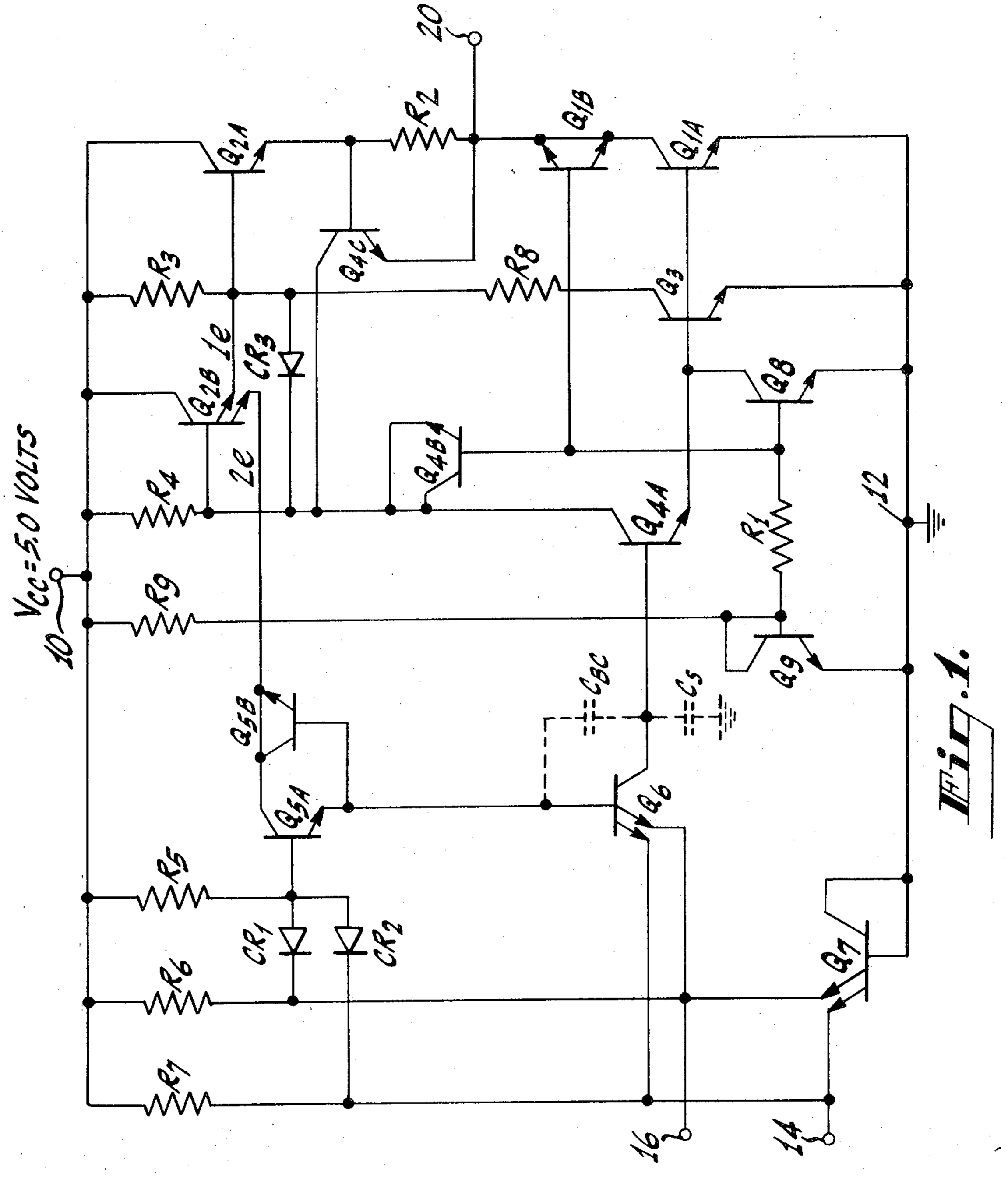
FIG. 1 is a schematic diagram of a logic gate embodying the invention.

The two-input logic circuit of FIG. 1 includes an input section which combines features of diode-transistor logic (DTL) and transistor-transistor logic (TTL). Some transistors in FIG.

1 are identified by numerical and alphabetic subscripts. This is done to emphasize that all transistors having the same numerical subscript may have the same collector diffusion.

The input section includes multiemitter transistor Q6 having its collector connected to the base of transistor Q4A and each of its emitter electrodes connected to a different one of input terminals (14, 16). Capacitance $C_S$, connected between the collector of transistor Q6 and ground, is drawn with dashed lines to indicate that it is a distributed parameter. $C_S$ represents the collector-to-substrate capacitance of transistor Q6 as well as any other distributed and stray capacitance associated with that node. Capacitance $C_{BC}$, also drawn with dashed lines, includes the collector-to-base capacitance of transistor Q6. The circuit may have more than two input terminals and transistor Q6 may have more than two emitters but for ease of illustration the drawing is so limited. Diode connected transistor Q7 which has its collector and base connected in common to terminal 12 and each of its two emitters to a different one of the input terminals (14, 16) is provided to suppress positive and negative going transients. Pullup resistors R6 and R7 are connected between power supply terminal 10 and input terminals 16 and 14, respectively.

As in DTL circuits, input diodes CR1 and CR2 have their cathodes connected to terminals 16 and 14 respectively and their anodes connected in common to the base of transistor Q5A to which is also connected one end of current source resistor R5. The other end of resistor R5 is connected to positive power supply 10 so that current through resistor R5 is in a direction to forward bias the base-to-emitter junction of transistor Q5A and/or diodes CR1 and CR2. The emitter of transistor Q5A is connected to the base of transistor Q6 and the collector of transistor Q5A is connected to the second emitter electrode (**2*e***) of collector load (current) switching transistor Q2B. Transistor Q5B has its base connected to the emitter of transistor Q5A and its collector and emitter connected in common to the collector of transistor Q5A. The capacitances associated with the collector-base and emitter-base junctions of transistor Q5B are thus connected in parallel across the collector-to-emitter of transistor Q5A.

The first emitter (**1*e*) of transistor Q2B is connected in common to the base of transistor Q2A and to one end of resistors R3 and R8. The other ends of resistors R3 and R8 are connected to terminal 10 and to the collector of transistor Q3, respectively. Resistor R4 is connected between the base of transistor Q2B and terminal 10 and the collectors of transistors Q2B and Q2A are connected to terminal 10. The collectors of transistors Q4C and Q4A as well as the collector and emitter of transistor Q4B are connected to the base of transistor Q2B. The collector-to-base as well as the emitter-to-base junctions of transistor Q4B are connected in parallel between the collector of transistor Q4A and the base of transistor Q8. This, as explained below, provides AC coupling between the two points. The emitter of transistor Q4A is connected to the collector of shunt bias transistor Q8 and the bases of transistors Q3 and Q1A. The emitters of transistors Q3, Q1A and Q8 are connected to the negative power supply terminal 12**.

The collector of transistor Q1A is connected to output terminal 20 to which is also connected the base and collector of transistor Q1B, the emitter of transistor Q4C, and one end of resistor R2. The other end of resistor R2 is connected in common to the base of transistor Q4C and the emitter of transistor Q2A. A diode CR3 may also be connected with its anode connected to the base of transistor Q2A and its cathode connected to the collector of transistor Q4C. The combination of transistor Q4C, resistor R2, and diode CR3 limits the output current to a safe value. The base electrodes of transistors Q1B and Q4B are connected in common to the base of transistor Q8 to which is also connected one end of resistor R1. The base of transistor Q8 is thus coupled by means of the junction capacitances of transistors Q4B and Q1B, respectively, to the collector of transistor Q4A and to the collector of transistor Q1A.

A bias network to generate a relatively constant steady state shunt current includes resistor R9 and R1 and transistors Q9 and Q8. Resistor R9 is connected between terminal 10 and the common connection of the base and collector of diode connected transistor Q9. The emitter of transistor Q9 is connected to terminal 12 and resistor R1 which controls the amount of base current into transistor Q8 is connected between the base of transistors Q9 and Q8.

The operation of the circuit is best understood by examining the response of the circuit to a complete cycle of the input waveform, i.e., (1) all signal inputs in the steady-state "high" condition; (2) transition of at least one input from the "high" to the "low" condition; (3) at least one input in the steady-state "low" condition; (4) transition of all "low" inputs to the "high" condition. Assume for the remainder of this description that the magnitude of the potential applied between terminals 10 and 12 is approximately 5 volts and that the base-to-emitter voltage drop, $V_{BE}$, of these transistors in the forward direction is approximately 0.75 volts.

I. Assume that the input signals applied to terminals 14 and 16 are "high" with each signal being 4 volts or more. Under this condition, a steady-state current flows through current source resistor R5, the base-to-emitter junction of transistor Q5A, the base-to-collector junction of transistor Q6, into the base of transistor Q4A and, amplified, out of the emitter of transistor Q4A to provide the base current for transistors Q3 and Q1A, which are connected in parallel and the collector current for transistor Q8. If the potential at the base of transistors Q3 and Q1A is 0.75 volt, the voltage at the base of transistor Q4A is 1.5 volts, the voltage at the base of transistor Q6 is 2.25 volts and the voltage at the base of transistor Q5A is 3 volts. Since the input signals applied at terminals 14 and 16 are assumed to be at least 4 volts, diodes CR1 and CR2 are reverse biased. In addition, the multiple emitter-to-base junctions of transistor Q6 are also reverse biased since the base is at 2.25 volts while the emitters are at least at 4 volts.

Transistor Q4A is operated as a phase splitter, amplifying the base current supplied to its base and generating in response thereto an in-phase signal at the emitter and an out-of-phase signal at the collector. In the all inputs "high" steady-state condition, transistor Q4A is saturated since its forward current transfer ratio ($\beta$) exceeds the ratio of available collector current ($I_{C4A}$) to available base current ($I_{B4A}$). In other words, $\beta \times I_{B4A}$ is greater than the available $I_{C4A}$.

Assuming the collector-to-emitter saturation voltage of transistor Q4A to be approximately 0.25 volt $$(V_{CE_{SAT}} = 0.25 \text{ volt})$$

and its emitter to be at 0.75 volt, the collector potential of transistor Q4A is approximately 1.0 volt. In order for current to flow from the second emitter of transistor Q2B, the potential at its base must exceed 3.1 volts (the potential at the emitter of transistor Q5A plus the $V_{CE}$ offset of transistor Q5A plus the $V_{BE}$ of transistor Q2B). Thus, since the base potential of transistor Q2B is maintained at 1.0 volt by the collector of transistor Q4A, no current flows into the collector-to-emitter of transistor Q5A and its collector-to-emitter voltage is equal to the $V_{CE}$ offset.

It is of importance to note at this point that in this steady-state condition, transistor Q5A permits base-to-emitter current flow but provides no collector-to-emitter current. Transistor Q5A is thus operated as a diode and there is no increase in power dissipation under steady-state conditions due to its presence. It should also be noted that transistor Q2B which provides the collector current to transistor Q5A is rendered nonconducting by means of the conduction of transistor Q4A in response to the amount of current generated by transistor Q5A.

The emitter current of saturated transistor Q4A is comprised of the current through resistor R5 ($I_{R5}$) and the current through resistor R4 ($I_{R4}$). $I_{R5}$ is approximately equal to the difference in potential between terminal 10 (5 volts) and the base of transistor Q5A ($4 \times V_{BE}$) divided by the ohmic value of R5, $[(V_{cc} - 4 \times V_{BE})/R5]$; and, $I_{R4}$ is approximately equal to the difference in potential between terminal 10 (5 volts) and the collector voltage of Q4A ($V_{BE} + V_{CE_{SAT}}$) divided by the ohmic value of resistor R4, $$\frac{[V_{cc} - (V_{BE} + V_{CE_{SAT}})]}{R4}.$$

The emitter current of transistor Q4A provides the base drive for transistors Q3 and Q1A and the collector current to transistor Q8. The amount of current division between the bases of transistors Q3 and Q1A is a function of the ratio of their areas and the ratio of actual emitter currents. The division of base currents is controlled to ensure that Q1A is capable of sinking the variable load current into output terminal 20 which may, for example, range from 2.5 milliamperes to 20 milliamperes. Sufficient base drive must be applied to transistor Q1A to make sure that it is saturated when carrying the maximum rated output load current which must be sunk. In addition to the base drive to transistor Q1A, sufficient base drive must be supplied to transistor Q3 in order to cause it to saturate. The sum of these two base currents plus the constant collector current shunted by transistor Q8 is supplied by the emitter current of transistor Q4A. Transistor Q8, as more fully set forth below, acts as a shunt path across the base-to-emitter regions of transistors Q3 and Q1A and due to AC coupling into its base, causes transistors Q3 and Q1A to turn "off" rapidly when the input signals go low.

The steady-state collector current drawn by transistor Q8 is determined by the biasing circuit comprising resistor R9, diode connected transistor Q9 and resistor R1. The current through resistor R9 ($I_{R9}$) is substantially equal to the difference in potential between $V_{cc}$ and the $V_{BE}$ of transistor Q9 divided by the resistance of R9, $[(V_{cc} - V_{BE})/R9]$. Most of this current flows into the collector and base of transistor Q9 developing a potential which is applied across the series combination comprising resistor R1 and the base-to-emitter junction of transistor Q8. The current through resistor R1 and into the base of transistor Q8 is approximately equal to the difference in potential between the base-to-emitter voltage of transistor Q9 and the base-to-emitter voltage of transistor Q8 divided by the ohmic value of resistor R1; $\frac{(V_{BE_9} - V_{BE_8})}{R1}$. (In addition to the difference in size, transistor Q9 conducts more collector current than transistor Q8 and hence the $V_{BE}$ of the former will be greater than that of the latter.) The collector current of transistor Q8 ($I_{Q8}$) may thus be adjusted to be a well defined ratio of the collector current of transistor Q9 ($I_{Q9}$).

In a circuit embodying the invention, $I_{Q9}$ was set to approximately 500 microamperes by making resistor R9 equal to 10 kilohms. Resistor R1 was selected to be a minumum of 1 kilohm to isolate (somewhat) the base of transistor Q8 from the base of transistor Q9. Transistor Q8 was designed to ensure that, with R1 equal to 1 kilohm, the steady-state value of $I_{Q8}$ was approximately equal to one-half $I_{Q9}$ ($\approx$250 microamperes). Transistor Q8 thus sinks a small steady-state current which results in a very efficient bias control and in minimal current waste.

With transistor Q4A conducting and saturated, the potential at the base of transistor Q2B is 1 volt. Assuming transistor Q3 also to be saturated and its collector-to-emitter saturation voltage to be 0.2 volt, the current flowing through the resistors R3 and R8 is approximately 2.25 milliamperes. If, for example, resistor R8 is 100 ohms, the potential at the first emitter (1*e*) of transistor Q2B, which is common to the base of transistor Q2A, is approximately 0.425 volt. Under this condition, the base of transistor Q2B is forward biased with respect to its first emitter by a potential of 0.575 volt. Since the threshold of the base-to-emitter junction is 0.75 volt, transistor Q2B is not biased into conduction.

Maintaining the base-to-emitter potential of transistor Q2B slightly below the turn on threshold is advantageous in that it permits very rapid turn on of the transistor. Since most of the charge needed to turn on transistor Q2B is stored during the steady-state operation, little additional charge is required to turn it on completely (as described below) and this minimizes its turn on time.

With transistors Q3 and Q1A saturated, the base potential of transistor Q2A is maintained at 0.425 volt and its emitter potential is equal to the potential at output terminal 20 which is equal to the saturation voltage of transistor Q1A. The base-to-emitter potential of transistor Q2A is thus well below the 0.75 volt threshold and transistor Q2A, through forward biased, remains nonconducting.

Finally, it should be noted that for the steady-state condition, there is no conduction in or through the junctions forming transistors Q1B, Q4B and Q5B.

II. One or more of the input signals (applied to terminals 14 and 16) make a transition from the steady-state "high" of 4 volts or more to a "low" of 0.35 volt or less.

The negative-going transition at the input occurs very quickly and the response of the present circuit follows almost as rapidly. However, it is important for a better understanding of the operation and to best appreciate the advantages of the circuit, to identify the sequence of events that occur in the circuit as the input signal switches from "high" to "low."

First, when the input signal voltage reaches 2.25 volts, the current in resistor R5 ceases to flow into the base region of Q5A and instead begins flowing through one or both of the input diodes CR1 and CR2 (depending on which of the input signals has made the transition to "low"). Assuming the threshold of diodes CR1 and CR2 to be 0.75 volt and recalling that under steady-state conditions the base of transistor Q5A is at 3 volts ($4V_{BE}$), it follows that the current through R5 will flow into CR1 or CR2 when the signal associated with their input terminal drops below 2.25 volts.

Secondly, when the input signal reaches 1.5 volts, the base-to-emitter junction of transistor Q6 ($V_b$ of transistor Q6 is assumed to remain at 2.25 volts during the input transition from 2.25 volts to 1.5 volts) becomes forward biased and the emitter current of transistor Q5A ceases to flow into the base collector diode of transistor Q6. It is important to note that the circuit thus exhibits a dual threshold characteristic. The first threshold as described above occurs when one or both diodes CR1 and CR2 begin conducting preventing further base drive into transistor Q5A and the second threshold occurs when the base-to-emitter junction of transistor Q6 begins conducting. The importance and usefulness of this dual threshold characteristic is described subsequently.

The effectiveness of transistor Q6 to switch the charge carriers from $C_S$ is not obvious, because no steady-state current is supplied at this time to its base (which ordinarily would be present in conventional TTL circuits). However, in this circuit, transient current provides base current to transistor Q6 which causes transistor Q6 to conduct as a transistor and therewith carry out its sweeping function with respect to $C_S$. It is to be recalled that in the previous steady-state condition when the base-emitter junctions of transistor Q6 are reverse biased, transistor Q6 has been in saturation with all its base current flowing to its collector. Transistors operating in this mode exhibit delay times of a few hundred picoseconds when a current is subsequently drawn from their emitters. Thus, when one or more of the base-emitter junctions of transistor Q6 becomes forward biased, the charge stored in the base collector junction is instantly available to provide current into the base. Additionally, as the input continues to fall from 1.5 volts to 0.35 volt or less, the base of transistor Q6 falls concurrently from 2.25 volts to 1.10 volts or less, because one or more of its base-to-emitter regions is forward biased.

If it is assumed, for the instant, that the collector potential of transistor Q6 were to be maintained at 1.5 volts, two capacitances would contribute to the base drive of transistor Q6. The stray base to substrate capacitance (not shown) and the collector-to-base capacitance would provide their stored charge to the base of transistor Q6 since the base-to-emitter region of transistor Q6 provides a path for the flow of their charges. The base current in transistor Q6 causes a current to flow between the collector and emitter which is its forward current ratio ($\beta$) times the base current. The collector-to-emitter current thus sweeps out the charges present on $C_S$. During this period there is one action that is detrimental to the performance of transistor Q6. That is, the stored base-to-emitter charge of transistor Q5A must be reduced to zero by flowing in the reverse direction through the base-to-emitter of transistor Q6. However, it can be shown that the available forward charge exceeds the reverse charge by an adequate margin. In practice, measured waveforms at the collector of transistor Q6 in the circuit embodying the invention are not discernibly different than those of a standard TTL circuit. Thus, it has been shown that transistor Q6 conducts current from its collector to its emitter in transistor fashion thereby rapidly removing or "sweeping" the charge stored at the base of transistor Q4A and turning it off very quickly. It should also be appreciated that a single transistor (Q6) is connected between the base of transistor Q4A and the input terminals. This assures that when transistor Q6 conducts and saturates, a very low impedance or saturation voltage is present between the base of Q4 and the input node.

The operation of transistor Q6 may be further enhanced by means of the addition of transistor Q5B which is operated as a capacitor and which couples the rising potential at the collector of transistor Q5A to the base of transistor Q6. As the collector voltage of transistor Q5A becomes more positive (transistor Q5A is being turned off and transistor Q4A is being turned off allowing Q2B whose base is connected through resistor R4 to $V_{cc}$ to drive the collector of transistor Q5A towards $V_{cc}$) more charge is coupled to the base of transistor Q6 (driving it harder into conduction) through the capacitance of the reverse biased junctions of transistor Q5B.

The cutoff of transistor Q4A is further aided by the stored charge of transistors Q3 and Q1A since they maintain the emitter of transistor Q4A at a positive potential which causes the base-to-emitter junction of transistor Q4A to be momentarily reverse biased. This occurs since the emitter of transistor Q4A is momentarily held at 0.75 volt while its base voltage is equal to the low level (0.35 volt maximum) plus the saturation voltage of transistor Q6 which may be assumed to be 0.3 volt maximum for this condition.

With the cutoff of transistor Q4A, no more current is supplied to the bases of transistors Q3 and Q1A. The stored charge on the bases will normally be removed by the collector current of forward biased transistor Q8. In addition to the steady-state bias, the base of transistor Q8 is also AC coupled to the collector of transistor Q4A by means of the capacitance of the reverse biased junctions of transistors Q4B. As Q4A cuts off, its rise in collector voltage is AC coupled to the base of transistors Q8. Transistor Q8 which was conducting a steady and relatively constant current (250 microamperes) starts conducting additional collector current immediately. The additional current which transistor Q8 can carry is the AC current coupled through capacitor Q4B multiplied by the forward current ratio of transistor Q8. The decoupling provided by resistor R1 now becomes important since its resistance ensures that the AC coupled current flows largely into the base of Q8 rather than being shunted into the collector of transistor Q9. Transistor Q8 conducts an increased collector current so long as the collector potential of transistor Q4A rises and thus cuts off transistors Q1A and Q3 quickly and positively.

Concurrently with the rise in the collector voltage of transistor Q4A, transistor Q2B is turned on. Transistor Q2B is turned on very quickly since only a slight positive increment in its base voltage is necessary to turn it on. Transistor Q2B provides a current into the base of transistor Q2A equal to its forward current ratio multiplied by the base current available to it. There is negligible resistance limiting the current flow between the emitter of transistor Q2B and the base of transistor Q2A which minimizes the turn on time of Q2A. During the time that transistors Q2B and Q2A are turning on, the stored charges associated with transistors Q1A and Q3 have been "swept out" by transistor Q8 reducing their collector current to zero.

Transistors Q1A and Q3 are quickly turned off when transistor Q2A is turned on to prevent undesirable power transients and the associated increase in power dissipation. Another major advantage of concurrently turning off Q1A and turning on Q2A is that the total emitter current of transistor Q2A is made available to charge the load capacitance which rapidly drives the signal at output terminal 20 to the "high" state.

The output is also AC coupled to the base of Q8 by means of the reverse biased junctions of transistor Q1B. As the voltage at output terminal 20 rises, the signal is fed back to the base of transistor Q8 which conducts more current as described above. This increased current of transistor Q8 offsets the effect of the Miller capacitance associated with the collector-to-base junction of transistor Q1A. Thus, though the rise in the collector voltage of transistor Q1A is coupled back to its base by its collector-to-base capacitance, the increased conduction of transistor Q8 effectively prevents the additional charge from flowing into the base of transistor Q1A.

The current limiting circuit comprising transistor Q4C and resistor R2 controls the maximum output current through transistor Q2A. As explained below, when the output signal goes to or is in the high state (4 volts or more) and a short circuit is applied to terminal 20, the limiting circuit maintains the emitter current of Q2A below a predetermined and safe value. In the "high" state, current flows through resistor R2 and develops a potential drop which is applied between the base-to-emitter region of transistor Q4C. When the voltage across resistor R2 exceeds the threshold voltage (0.75 volt) of transistor Q4C, the latter begins conducting and draws its collector current from current source resistor R4. This action reduces the current available to the base of transistor Q2B thereby decreasing the available current at the first emitter of transistor Q2B which in turn decreases the current drive into the base of transistor Q2A and hence the output current. After the current at the first emitter of Q2B is reduced to zero, further action of transistor Q4C can forward bias diode CR3 thereby further decreasing the current drive to the vase of transistor Q2A. Note that diode CR3 provides a path which shunts the current flowing through resistor R3 from the base-to-emitter path of transistor Q2A. Without this connection, the output current could possible exceed the limited value of the beta of transistor Q2A multiplied by the base drive available through resistor R3 exceeds the limited value.

In a circuit embodying the invention, resistor R2 was selected to be 18 ohms which for a threshold voltage of 0.75 volt sets the output current level at approximately 42 milliamperes. Limiting the maximum output current protects the circuit from passing excessive currents and also minimizes the power dissipation.

Figures 2, 3:
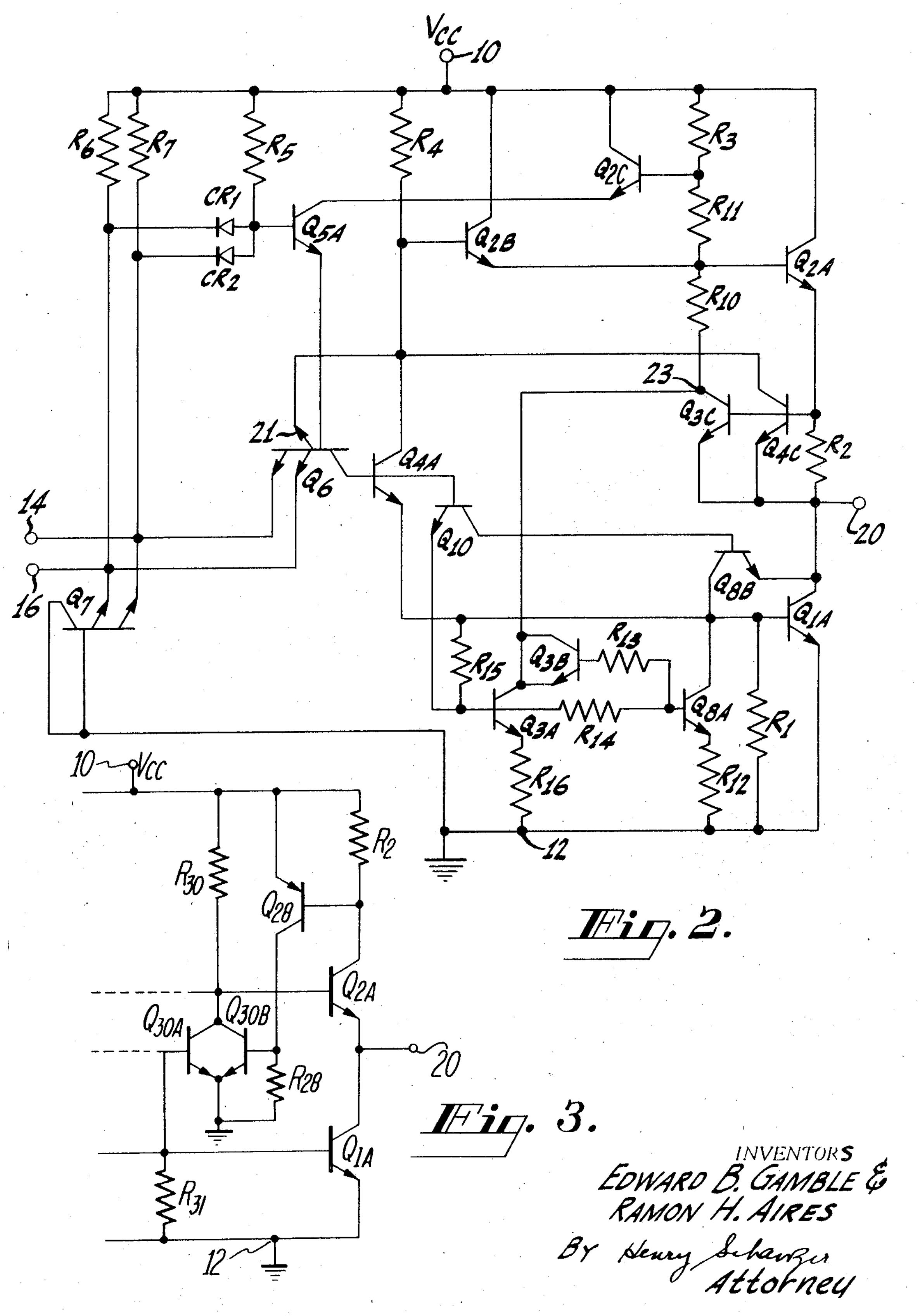
FIG. 2 is a schematic diagram of another logic gate embodying the invention.
FIG. 3 is a schematic diagram of the output portion of a logic gate embodying the invention using PNP-transistors for current limiting.

The addition of the limiting circuit places no stringent limitations on the rate of rise of the output. It should be noted that a constant current of 40 milliamperes will charge a 50 picofarad capacitance ($50\times10^{-12}$ f.) present at the output terminal 20, at the rate of 0.8 volt per nanosecond so that the output voltage would rise to 2.4 volts within 3 nanoseconds after the start of output current flow. The current regulator thus does not significantly decrease the rise time of the positive going output signal while providing the safety feature described. A combination of NPN- and PNP-type transistors can be used to further advantage in the implementation of the current limiting feature. This concept is illustrated in FIG. 3 which is the functional equivalent of the output portion of the circuit of FIG. 1. In the circuit of FIG. 3, the limiting function is performed by moving R2 to the collector of Q2A and using the combination of NPN-transistor Q30B, resistor R28 and PNP-transistor Q28 to shunt available current from the base of transistor Q2A. The PNP-transistor Q28 may be purposely designed as a lateral-type PNP and to have a very slow response as compared to the other transistors in the circuit. Due to the slow response of the PNP, the output current will not be limited during the first part (or leading edge) of an output pulse of current resulting in a faster rise time when driving a capacitive load However, if the excessive current exists longer than an initial charging transient, the PNP will respond and cause shunting of the base current available to transistor Q2A; thus providing a steady-state short circuit protection.

III. One or more inputs at a steady-state "low" of 0.35 volt or less. Under this condition, steady-state current flows through resistor R5 and through the anode to cathode junctions of those diodes, (CR1, CR2) whose input signals are low. In addition, bias current flows through resistor R9 into the collector-base of transistor Q9 and through resistor R1 into the base of transistor Q8. The collector current of transistor Q8, as described above, shunts to ground any leakage current due to transistors Q4A, Q3 or Q1A and therefore maintains transistors Q3 and A1A in the cutoff condition. With transistor Q3 cut off all base current that may be required to support the load current at the emitter of transistor Q2A flows through resistor R3 and into output terminal 20.

All other transistor junctions are nonconducting in this steady-state condition except for leakage currents which may be neglected. The power dissipation for the steady-state "low" condition is thus minimized by using a biasing scheme which draws very little current in the steady state.

IV. Transition of all "low" inputs from 0.35 volt or less to 4.0 volts or more. The transition of the input signals, as noted above, occurs within a few nanoseconds. However, the sequence of events as the voltage increases are identifiable and are set forth to bring out more clearly the operation of the circuit. First, the current through resistor R5 starts transferring from the input diodes into the base of transistor Q5A. Total current transfer of the current through resistor R5 does not occur until the input voltage reaches 2.25 volts. However, the transfer of some current starts immediately, with the positive going transition of the input signal, since the emitter of transistor Q5A is held at a low value of potential by various stray and shunt capacitances coupling it to the substrate and hence to ground potential.

It is important to note that the current available at the emitter of transistor Q5A to charge these capacitances is the available base current multiplied by the forward current ratio of transistor Q5A. During the transient interval following the positive going transition, the collector-to-second emitter of transistor Q2B provides a very low impedance between the collector of transistor Q5A and the source of potential $V_{cc}$. That is, transistor Q2B can provide all the collector current that transistor Q5A requires. Transistor Q2B has thus changed from a very high impedance cutoff condition (described under I above) to a relatively low impedance (highly forward biased condition). The high conduction level of transistor Q5A is an important feature of the configuration since it avoids undesirable delay in charging the capacitance associated with the input of transistor Q4A. Thus the base of Q4A reaches its required turn on threshold voltage (1.5 volts) very rapidly. Transistor Q5A continues to amplify the current generate through current source resistor R5 and to apply the amplified current to transistor Q4A until the potential at the collector of the latter falls below approximately 3 volts. At that point, the collector potential of transistor Q5A tends to become lower than its emitter potential since transistor Q2B is being cut off by the signal fed back from the collector of transistor Q4A. There is thus a feedback arrangement which cuts off the supply of collector current to transistor Q5A when its emitter current causes the collector potential of transistor Q4A to fall below 3.0 volts. Following the charging transient, transistor Q5A is effectively turned into a diode since its collector supply is cut off. Transistor Q5A thus provides an amplified current during the initial transient period to ensure rapid turn on and a steady-state current of much lower amplitude thereafter. As the gate output is being switched in response to the increasing signal at the input terminal, the collector supply of transistor Q5A is cut off and the steady-state power dissipation is reduced to a level typical of a much slower logic gate.

At this point, the additional features of the feedback through transistor Q4C and diode CR3 to transistor Q4A which quickly discharge the output circuit should be noted. In response to the transition of all low inputs to the high level, the output 20 is switched from the "high" level to the "low" level. However, when transistor Q4A first turns on, its collector potential drops quickly while the potential at output terminal 20 may still be "high" (4 volts or more) due in part to charge stored on the capacitance associated with the output 20. When the collector voltage of transistor Q4A falls and is approximately 0.75 volt below the potential present at supply terminal 10, diode CR3 becomes forward biased. Thus, until transistor Q3 subsequently turns on and lowers the potential at the base of transistor Q2A, the latter potential is forced to fall at the same rate as the potential at the collector of transistor Q4A. This action ensures the "off" condition of Q2A initially and throughout the fall of the voltage at output 20.

Second, when the collector voltage of transistor Q4A falls further and its approximately 0.75 volt below the potential present at terminal 20, the base-to-collector junction of transistor Q4C becomes forward biased. This effectively provides a forward biased (base-to-collector) diode connected between the emitter of transistor Q2A and the collector of transistor Q4A.

Transistor Q4A now obtains its collector current through resistor R4 and from the output 20 through resistor R2 and the base-collector diode of transistor Q4C. Note that sufficient base drive is supplied to transistor Q4A such that transistor Q4A can conduct current from output 20 in addition to current from resistor R4 and provide an increased emitter current to the bases of transistors Q3 and Q1A.

Transistor Q1A amplifies by its forward current ratio ($\beta$) the current supplied to its base and "sinks" the amplified current out of terminal 20. It should thus be appreciated that the collector-to-emitter current of transistor Q4A, a portion of which is drawn from the output 20, gets multiplied by the forward current ratio of transistor Q1A and that this amplified current is then drawn out of the output 20. Any charged capacitance at output 20 is thus quickly discharged through the two paths mentioned. As the potential at output 20 drops within a diode drop of the quiescent potential at the collector of transistor Q4A, the base-to-collector diode of transistor Q4C becomes reverse biased and the feedback path is opened.

Transistor Q4C thus serves to limit the output current and to provide a feedback path to enable the rapid discharge of the output circuit. Diode CR3 thus serves to assist the limiting of the output current and to provide a feedback path to ensure the "off" condition of transistor Q2A during the fall of the output voltage.

The input section of FIG. 2, including diodes CR1, CR2, resistors R5, R6 and R7, transistor Q7, the base and emitter connection of transistor Q5A and two of the emitter connections of transistor Q6, is connected the same as shown in FIG. 1.

An additional emitter 21 on transistor Q6 is connected to the collector of transistor Q4A to prevent the latter from saturating as described below. The collector of transistor Q6 is connected to the base of transistor Q4A and the base of transistor Q10. The emitter of transistor Q4A is directly connected to: (1) the base of output transistor Q1A which as in FIG. 1, sinks current from terminal 20; (2) the collector of biasing transistor Q8A which as in the circuit of FIG. 1, draws current out of the base of transistor Q1A when the latter is to be turned off; (3) the collector of transistor Q8B; (4) to one end of resistor R15; and (5) to one end of resistor R5. The emitter of transistor Q10 is connected to the other end of resistor R15, to the base of transistor Q3A, and, through resistor R14 to the base of transistor Q8A. The emitter of transistor Q3A is returned to ground by resistor R16, the emitter of transistor Q8A is returned to ground by means of resistor R12, and the emitter of transistor Q1A is directly returned to ground. The base-to-emitter junction of transistor Q1A is shunted by resistor R1 in order to provide a path for leakage current as described below.

The collector of transistor Q5A is connected to the emitter of transistor Q2C whose collector is connected to terminal 10 and whose base is connected to the junction of resistors R3 and R11. The other end of resistor R3 is connected to terminal 10 while the other end of resistor R11 is connected in common to the emitter of transistor Q2B, the base of transistor Q2A and one end of resistor R10. Transistor Q2C provides a switchable current path between $V_{cc}$ and the collector of transistor Q5A.

Transistor Q4C performs the same regulating and feedback function performed by transistor Q4C in FIG. 1. Transistor Q3C has its base-to-emitter region connected in parallel with that of transistor Q4C and its collector connected in common with the collector of transistor Q3A at junction point 23. Transistor Q3B, operated as a capacitor which AC couples to the base of transistor Q8A the signals generated at junction point 23, has its collector and emitter connected to junction point 23 and its base connected through resistor R13 to the base of transistor Q8A. In comparison to the circuit of FIG. 1, the decoupling of capacitive loading (transistor Q4B in FIG. 1) from the collector of transistor Q4A allows the collector potential of the latter to change more quickly.

Transistor Q8B, which as described below together with transistor Q10 maintains transistor Q1A in "soft saturation," has its base connected to the collector of transistor Q10, its collector connected to the base of transistor Q1A and its emitter connected to the collector of transistor Q1A.

The operation of the circuit of FIG. 2 is similar to that of FIG. 1 and the detailed description which follows, deals mainly with those features which have been added or changed.

1. With at least one of the input signals "low" (0.35 volt or less) the output at terminal 20 is maintained "high" (3.8 volts or more). Transistors Q4A and Q10 are cut off and no current is fed to the bases of transistors Q1A, Q3A, Q8A and Q8B. Note that transistor Q8A is not intentionally forward biased as was Q8 in FIG. 1 and resistor R1 (of relatively high value) may be used to provide a shunt path for leakage current.

With transistor Q3A and Q3C cut off the base current required by transistor Q2A to hold output terminal 20 "high" flows through resistors R3 and R11. Under normal steady-state load conditions, the voltage drop across resistors R3 and R11 is not sufficient to forward bias transistor Q2B which therefore remains cut off. If the load current is increased, the voltage drop across resistors R3 and R11 may become sufficient to forward bias Q2B which then provides additional current into the base of transistor Q2A. If the load current is increased to the point that the voltage drop across R2 exceeds the $V_{BE}$ threshold of transistors Q3C and Q4C, they go into conduction with transistor Q4C shunting current from the base of transistor Q2B and transistor Q3C shunting current from the base of transistor Q2A. With this arrangement, current limiting is provided about transistor Q2A even for the case where the current through R3 and R11 multiplied by the beam of transistor Q2A exceeds the specified level.

2. When all the "low" input signals switch to the "high" level, the following events occur concurrently:

a. The emitter current of transistor Q5A is supplied through the base-to-collector diode of transistor Q6 to the bases of transistors Q4A and Q10. The base-to-emitter diode of transistor Q10 couples its base drive to transistor Q3A. Transistors Q4A and Q3A are essentially driven in parallel so that they pull down the bases of transistors Q2B and Q2A, respectively, at virtually the same time.

b. As the gate switches state, (the output goes from "high" to "low") the potential at the collector of transistor Q4A may drop faster than the potential at output terminal 20. Under this condition, the base-to-collector junctions of both transistors Q3C and Q4C become forward biased (as explained for the case of transistor Q4C in circuit of FIG. 1). The base-to-collector diodes of transistors Q4B and Q3C couple the output 20 to the collectors of transistor Q4A and Q3A, respectively, providing additional conduction paths which hasten the discharge of the stored charges at output 20.

In addition, it should be appreciated that this feedback coupling allows transistor Q4A to beta multiply its base drive and feed the amplified emitter current to the base of transistor Q1A. This causes Q1A which further amplifies the already amplified (Q4A) base current applied to its base to discharge the load capacitance very quickly.

c. In addition to the advantages listed above, feedback through the base-to-collector of transistor Q3C is advantageous in the following respect. Without feedback during the turnon period, transistor Q3A could saturate from the available overdrive and reflect the value of resistor R16 (which is a relatively low impedance chosen on the basis of direct current steady-state conditions) back to the collector of transistor Q6 loading down that point and reducing the base drive available to be amplified by transistor Q4A.

However, when the base-to-collector junction of transistor Q3C becomes forward biased, it drains current from the output 20 and maintains the collector potential of transistor Q3A sufficiently high so that it is out of saturation, ensuring thereby that its input impedance is beta times the resistance of resistor R16.

3. With all input signals maintained at a steady-state "high" level, two significant bias conditions should be noted:

a. Transistor Q8A is biased on in anticipation of the AC signal applied to its base when the gate output is switched to the "high" state. Having transistor Q8A "on" enables it to respond instantaneously to the increased signal and to sink the base current of transistor Q1A turning the latter off quickly. Transistor Q8A is biased with reference to transistor Q8A by means of base resistor R14 and emitter resistor R12. Resistors R12 and R14 are selected to ensure that there is little or no current hogging regardless of the beta of the transistors. For low values of beta resistors, R14 predominates and limits the base drive while for high value of beta R12 prevents excessive collector current being shunted by transistor Q8A from the base of transistor Q1A. Accordingly, the circuit of FIG. 2 does not require the biasing scheme (R9 and Q9) of FIG. 1.

b. Transistor Q2B is biased on in an anticipation of the rapidly rising potential which it will couple from the collector of Q4A to the base of output pullup transistor Q2A when the gate output is subsequently switched to the "-high" state. The biasing means for transistor Q2B will be subsequently described.

4. During the transition period as the output 20 is being switched from low to high in response to at least one base-to-emitter region of transistor Q6 being forward biased, the following occurs:

Transistors Q4A is cut off by the sweeping action of transistor Q6 and its collector potential is allowed to rise rapidly due to the pullup action of resistor R4 connected to $V_{cc}$. Transistor Q2B which is already biased on provides an emitter follower coupling means and couples its rapidly rising base potential directly to the base of output pullup transistor Q2A and to junction point 23 through resistor R10. The rising potential at junction point 23 is coupled by means of the two reverse biased junctions of transistor Q3B, operated as a capacitor, to the base of the still conducting transistor Q8A (as explained above Q8A is maintained in conduction in anticipation of this moment). The conduction of transistor Q8A is increased instantaneously, causing it to draw an increased collector current from the base of transistor Q1A, and the base of transistor Q3A by means of resistor R15. Transistor Q8A thus quickly sweeps out the stored charge in the base region of transistor Q1A to effectuate the quick turnoff of the latter. As in FIG. 1, the concurrent turning off of transistor Q1A and turning on of transistor Q2A ensure that the total emitter current of transistor Q2A is available to charge the load thereby preventing undesirable power transients and concomitant increase in power dissipation.

In the circuit of FIG. 2, the capacitive coupling is between the base of transistor Q8A and the collector of transistor Q3A as compared to the circuit of FIG. 1 where the capacitor (transistor Q4B) is coupled to the collector of transistor Q4A. The arrangement of FIG. 2 lowers the capacitive load at a very critical node (the collector of transistor Q4A). This enables the collector of transistor Q4A to rise more quickly and with it the potential at output 20 since it is emitter-follower coupled to that node. Also, the capacitor (transistor Q3B) is now driven by the low output impedance of emitter follower transistor Q2B which provide increased current to drive the respective coupling.

The important features and advantages of the circuit of FIG. 2 are the novel circuit means which for the "low" output state ensure the following circuit conditions:

a. Transistor Q4A maintained out of saturation.

b. The base drive to transistor Q1A and Q3A is ideally shared throughout the range of operation.

c. Output transistor Q2A is nonconducting; and d. Transistor Q1A is maintained in "soft saturation" throughout the range of load currents.

1. Nonsaturation of Transistor Q4A

Although this feature may provide some inherent increase in the speed of response of the circuit (as discussed below), its primary function is to provide the basis for other features which further increase the speed of response.

The addition of an extra emitter 21 to transistor Q6 which is connected to the collector of transistor Q4A maintains transistor Q4A nonsaturated as shown by the following: The emitter potential of transistor Q4A is one $V_{BE}$ above ground potential and its base potential is 2 $V_{BE}$ ($2\times V_{BE}$) above ground potential. The collector-to-emitter 21 voltage of transistor Q6 when its other base-to-emitter junctions are reverse biased is the $V_{CE}$ offset of that transistor which for a multiemitter transistor may typically be 150 millivolts. The potential at the collector of transistor Q4A is thus equal to its base voltage ($2V_{BE}$) minus the $V_{CE}$ offset of transistor Q6 ($2V_{BE}-V_{CE}$ offset). The collector-to-emitter potential of transistor Q4A is the difference of the two voltages and is equal to ($V_{BE}-V_{CE}$ offset) which, based on the assumed typical values, equals 0.6 volt. Thus, transistor Q4A is maintained in a nonsaturation operating mode. The emitter potential of transistor Q2B is referenced to, and is one $V_{BE}$ less than, the potential at the collector of transistor Q4A.

2. Nonsaturation of Transistor Q3A

Since transistor Q1A and Q4A normally conduct more current than transistors Q3A and Q10, the $V_{BE}$ drops of the former will be larger than those of the latter. By placing a resistor (R16) of appropriate value in the emitter circuit of transistor Q3A, the proper current balance can be achieved at light loads if resistors R3, R10 and R11 are selected so that transistor Q2B is biased slightly on. The emitter current of transistor Q2B (set in a typical embodiment to a minimum of approximately 100 microamperes) flows through resistor R10 to the collector of transistor Q3A. This keeps transistor Q3A from saturating and ensures that its input impedance remains equal to beta times resistor R16.

At full load, transistor Q1A sinks more current and its $V_{BE}$ drop increases. The increased $V_{BE}$ of transistor Q1A raises the potential at its own base and at the collector of transistor Q6. The increased potential causes more base current to be supplied to transistor Q3A. If transistor Q3A were saturated (i.e., it had limited collector current available) the additional current drawn by its base would be approximately equal to the change in potential divided by the value of resistor R16. However, with transistor Q3A not saturated and with transistor Q2B turned on, the additional current required by the potential increase across resistor R16 is supplied to the collector of transistor Q3A form the power supply via the collector-to-emitter of transistor Q2B and resistor R10. The base current drawn by transistor Q2A is then $1/\beta$ ($\beta$ is the forward current gain ratio and may typically be any value from 10 to 100) of what it would be if transistor Q3 were operated in saturation. Using the circuit embodying the invention, the current sharing problem is virtually eliminated since the current variation is reduced by beta and this varying current is drawn from a node which normally has excess drive available.

3. "Off" condition of transistor Q2A

The base of transistor Q2B is at the same potential as the collector of transistor Q4A; ($V_{BQ2B}$=2$V_{BE}$–$V_{CE}$ offset). Transistor Q2B, for reasons described above, is maintained very slightly "on" and its emitter voltage which is also the base voltage of transistor Q2A is one $V_{BE}$ drop below its base potential (i.e., the base of transistor Q2A is at $V_{BE}$–$V_{CE}$ offset). For the low output condition, the minimum potential at output terminal 20 is equal to the minimum saturation voltage ($V_{CE_{SAT}}$) of transistor Q1A which is typically 80 millivolts or more, even if deep saturation of transistor Q1A occurs. Since for this operating condition the emitter voltage of transistor Q2A is equal to the $V_{CE_{SAT}}$ of transistor Q1A, the base-to-emitter voltage of transistor Q2A is ($V_{BE}$–$V_{CE}$ offset–$V_{CE_{SAT}}$) sufficiently below the threshold level of the transistor to maintain it in the nonconducting region. Note however that although Q2A is not conducting, the forward voltage applied enables it to turn on quickly.

4. Soft saturation of transistor Q1A

Transistor Q1A is maintained in soft saturation (i.e., no excess base drive) by means of the action of transistors Q10 and Q8B. Looking between the collector of transistor Q6 and ground, it may be seen that the base-to-emitter regions of transistors Q4A and Q1A are serially connected to form one conduction path and that the base-to-collector diode of transistor Q10 in series with the base-to-emitter of transistor Q8B and the collector-to-emitter of transistor Q1A forms a possible other conduction path.

The $V_{BE}$ drops of transistors Q1A and Q4A are normally greater than the $V_{BC}$ drop of transistor Q10 and the $V_{BE}$ drop of transistor Q8B. When the $V_{BE}$ drops of transistor Q1A and Q4A become sufficiently large and the $V_{CE}$ of transistor Q1A becomes sufficiently low, the base-to-collector diode of transistor Q10 and the base-to-emitter region of transistor Q8B become forward biased. When transistor Q8B turns on, it draws its collector current from the drive supplied to the base of transistor Q1A. Enough current is thereby shunted to the collector of transistor Q1A to establish an equilibrium condition. In a typical circuit embodying the invention, the output voltage was found to vary from 225 millivolts to 350 millivolts as the current sunk by transistor Q1A was increased from no load (2 milliamperes) to full load (20 milliamperes). This compares with variations in the output voltage of 80 millivolts to 325 millivolts in a typical circuit not having the antisaturation feature disclosed. The feature has also been accomplished within the normal output voltage requirements for such a logic gate (that being output low voltage greater than or equal to 0.40 volt).

The transistors used in the embodiment shown in FIGS. 1 and 2 are all of the NPN-type but it should be evident that transistors of a different conductivity type suitably connected to take care of the difference in conductivity could also have been used.

What is claimed is:

1. In combination;

a transistor having a collector, emitter and base;

a pair of terminals for an operating voltage coupled to said emitter and collector;

a controllable shunt current path which continuously carries current connected between said emitter and base;

means for supplying a current to said base of said transistor for causing current flow in the forward direction through the base-to-emitter path of said transistor and for concurrently causing current also to flow through said shunt current path, whereby an operating voltage applied to said terminals causes current to flow through the emitter to collector path of said transistor;

means for terminating the flow of said current to said base; and means responsive to said termination of current flow for substantially increasing the conductance of said shunt current path, for causing current flow in the loop comprising said shunt current path and the base-to-emitter path of said transistor in a direction to reverse bias the base with respect to the emitter of said transistor.

2. In the combination as set forth in claim 1, said means for supplying the current to said base comprising the base-to-emitter and collector-to-emitter paths of a second transistor, said means for terminating the flow of said current to said base comprising means for cutting off said second transistor, and said means responsive to said termination of current flow comprising means coupled to the collector of said second transistor and responsive to the change in voltage thereat when said second transistor is cut off for applying a signal to said controllable shunt current path.

3. In the combination as set forth in claim 1, said means responsive to said termination of current flow comprising means connected to the collector of said transistor and responsive to the change in the voltage thereat when the supply of current to said base is terminated for applying a signal to said controllable shunt current path.

4. In the combination as set forth in claim 1, said controllable shunt current path comprising the emitter-to-collector path of a transistor, said last named transistor also having a base, means for applying a quiescent bias current to said base for permitting the flow of a quiescent current through the emitter-to-collector path of said last named transistor, and said means responsive to said termination of current flow comprising means for applying a signal to the base of said last named transistor in a sense to increase current flow through the emitter-to-collector path of said transistor.

5. The combination as claimed in claim 2, wherein said controllable shunt current path comprises the emitter-to-collector path of a third transistor, said third transistor also having a base, and wherein said means for causing current to flow through said shunt current path supplies a quiescent current to said base.

6. The combination as claimed in claim 5, wherein said means responsive to the termination of current flow comprises capacitive means coupled between the collector of said second transistor and the base of said third transistor for alternating current coupling to said conduction path a signal having a polarity to increase the conductance of said shunt current path.

7. The combination as claimed in claim 6, wherein said capacitive means includes at least one normally reverse biased semiconductor junction, whereby the capacitance of said semiconductor junction couples the signal generated at the collector of said second transistor to the base of said third transistor.

8. The combination as claimed in claim 7 further including a fourth transistor having a base, an emitter and a collector means coupling the collector of said fourth transistor to one of said pairs of terminals, means coupling the emitter of said fourth transistor to the collector of said transistor to form an output terminal, and means coupling the base of said fourth transistor to the collector of said second transistor; and, wherein the base of said transistor is connected to the emitter of said second transistor, whereby said transistor is turned on when said fourth transistor is turned off and said transistor is turned off when said fourth transistor is turned on.

9. The combination as claimed in claim 8 further including capacitive means coupled between said output terminal and the base of said third transistor.

10. In combination;

a transistor having a collector, emitter and base;

an impedance connected in series with the emitter-to-collector path of said transistor;

terminals for an operating voltage coupled across the series circuit of said emitter-to-collector path and impedance;

means supplying a current in the forward direction to the base-to-emitter path of said transistor, whereby when an operating voltage is applied to said terminals current flows in the emitter-to-collector path of said transistor;

a second transistor having an emitter, collector and base, the emitter-to-base path of which is connected across said impedance and the collector of which is connected to the means supplying said current, responsive to a flow of current of greater than a given value through said impedance for diverting a portion of the current intended for the base to emitter path of said first transistor to the emitter-to-collector path of said second transistor;

means for turning off said supply of current and concurrently changing the value of the voltage at the collector of said second transistor in a sense to permit current flow through the base-to-collector path of said second transistor; and a shunt current path connected from the collector of said second transistor to one of said terminals for conducting the base-to-collector current of said second transistor.

11. In combination;

first, second and third transistors, each having a collector, emitter and base;

impedance means connecting the emitter of said first transistor to the collector of said second transistor to form an output terminal at said collector;

terminals for an operating voltage coupled across the series circuit of the emitter-to-collector paths of said first and second transistors and said impedance means;

means supplying a current in the forward direction to the base-to-emitter path of said first transistor, whereby when an operating voltage is applied to said terminals current flows in the emitter-to-collector path of said first transistor;

means connecting the emitter to base path of said third transistor across said impedance means and its collector to the means supplying said current, said third transistor being responsive to a flow of current of greater than a given value through said impedance means for diverting a portion of the current intended for the base to emitter path of said first transistor to the emitter-to-collector path of said third transistor;

means for turning off said supply of current and concurrently changing the value of the voltage at the collector of said third transistor in a sense to permit current flow from said output terminal through the base-to-collector path of said third transistor; and a shunt current path connected from the collector of said third transistor to the base of said second transistor for conducting the base-to-collector current of said third transistor into the base of said second transistor whereby the collector-to-emitter current of said second transistor is increased.

12. The combination comprising:

first and second transistors, each having a base, an emitter and a collector;

a source of current connected to the base of said first transistor for supplying current thereto;

means direct current connecting the collector of said first transistor to the base of said second transistor for normally supplying to the base of said second transistor through the base-to-collector diode of said first transistor the current supplied from said source to the base of said first transistor;

first and second terminals between which an operating voltage may be applied;

means connecting the emitter of said second transistor to said first terminal and the collector of said second transistor to said second terminal; and means direct current connecting the emitter of said first transistor to the collector of said second transistor for conducting a portion of the base current supplied to the base of said first transistor through the base-to-emitter of said first transistor into the collector of said second transistor when the sum of the collector-to-emitter potential of said second transistor plus the base-to-emitter potential of said first transistor is less than the sum of the base-to-collector diode drop of said first transistor plus the base-to-emitter diode drop of said second transistor.

13. The combination comprising:

first, second, third and fourth transistors each having a base, an emitter and a collector;

a source of current connected to the bases of said first and second transistors for supplying current to them;

means connecting the emitter of said first transistor to the base of said third transistor for normally supplying to the base of said third transistor the emitter current of said first transistor;

means connecting the collector of said second transistor to the base of said fourth transistor, means connecting the emitter of said fourth transistor to the collector of said third transistor;

first and second means coupling the emitters of said second and third transistors, respectively, to a first point of potential having a polarity to forward bias said transistors;

third and fourth means coupling the collectors of said first and second transistors, respectively, to a second point of potential having a polarity to reverse bias the collector-to-base regions of said transistors; and means connecting the collector of said fourth transistor to the base of said third transistor for drawing a portion of the base drive out of the base of said third transistor and through the collector-to-emitter path of said fourth transistor into the collector of said third transistor when the sum of the base-to-emitter potentials of said first and third transistor exceeds the sum of the base-to-collector diode drop, the base-to-emitter diode drop and the collector-to-emitter voltage drop of said second, fourth and third transistors, respectively.

14. The combination as claimed in claim 13 further providing an output terminal; and wherein said third transistor has its collector connected to said output terminal for conducting current from said output terminal through its collector-to-emitter path into said first point of potential.

15. In a logic circuit in combination:

at least one input terminal adapted to receive input signals; an output terminal for producing an output signal in response to an input signal; first and second power terminals for the application therebetween of a source of operating potential;

first, second, third, fourth, fifth, sixth and seventh transistors, each having a base, an emitter, and a collector;

means connecting the emitter of said first transistor to the collector of said second transistor at said output terminal;

means responsive to input signals applied at said input terminal coupled to the base of said third transistor for producing in-phase signals at its emitter and out-of-phase signals at its collector;

means connecting the emitter of said third transistor to the bases of said second and fifth transistors and to the collector of said fourth transistor;

a load resistor;

means connecting one end of said load resistor in common to the collector of said third transistor and the base of said sixth transistor, and means connecting the other end of said load resistor in common to the collector of said first and sixth transistors at said first power terminal;

means connecting the collector of said fifth transistor to the base of said first transistor and to the emitter of said sixth transistor;

means coupling the emitters of said second, fourth and fifth transistors in common at said second power terminal;

means coupling the base-to-emitter path of said seventh transistor in the collector-to-emitter path of said first transistor for sensing the current therethrough;

means coupling the collector of said seventh transistor to the base of said sixth transistor for drawing current out of the base of said sixth transistor when the output current is greater than a given value and for conducting current from the output to the collector of said third transistor when its collector potential is lower than the output voltage; and capacitive means coupled between the base of said fourth transistor and the collector of said third transistor for coupling the out-of-phase signal generated at said collector to the base of said fourth transistor.

* * * * *